United States Patent
Liang et al.

(10) Patent No.: US 11,275,185 B2
(45) Date of Patent: Mar. 15, 2022

(54) RAY DETECTOR AND RAY DETECTION PANEL

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Kui Liang, Beijing (CN); Xiaohui Liu, Beijing (CN); Jiangbo Chen, Beijing (CN); Da Li, Beijing (CN); Shuo Zhang, Beijing (CN); Zeyuan Li, Beijing (CN); Fanli Meng, Beijing (CN); Fan Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/641,708

(22) PCT Filed: Jun. 21, 2019

(86) PCT No.: PCT/CN2019/092380
§ 371 (c)(1),
(2) Date: Feb. 25, 2020

(87) PCT Pub. No.: WO2020/078030
PCT Pub. Date: Apr. 23, 2020

(65) Prior Publication Data
US 2021/0149063 A1 May 20, 2021

(30) Foreign Application Priority Data
Oct. 18, 2018 (CN) .......................... 201811213295.5

(51) Int. Cl.
*G01T 1/24* (2006.01)
*H01L 27/146* (2006.01)

(52) U.S. Cl.
CPC ........ *G01T 1/247* (2013.01); *H01L 27/14612* (2013.01); *H01L 27/14663* (2013.01)

(58) Field of Classification Search
CPC .............. G01T 1/247; H01L 27/14612; H01L 27/14663
See application file for complete search history.

(56) References Cited

U.S. PATENT DOCUMENTS 5,051,804 A * 9/1991 Morse ..................... H01L 31/09
257/463
2008/0302970 A1* 12/2008 Fujieda ................. G01T 1/2018
250/370.11

(Continued)

FOREIGN PATENT DOCUMENTS

CN 103094295 A 5/2013
CN 103681701 A 3/2014

(Continued)

*Primary Examiner* — Blake C Riddick
(74) *Attorney, Agent, or Firm* — Dilworth & Barrese, LLP.; Michael J. Musella, Esq.

(57) ABSTRACT

A ray detector and a ray detection panel. The ray detector includes a base substrate, a thin film transistor, a scintillator, and a photodetector; the scintillator is located on aside of the photodetector that is away from the base substrate; the photodetector includes: a first conductive structure; a semiconductor layer; a second conductive structure; a first dielectric layer; and a second dielectric layer, the second conductive structure is electrically connected with source electrode; the thin film transistor is located between the base substrate and the photodetector; and an orthographic projection of the thin film transistor on the base substrate at least partially falls into an orthographic projection of the photodetector on the base substrate.

17 Claims, 4 Drawing Sheets

(56) References Cited

U.S. PATENT DOCUMENTS

| | | | |
|---|---|---|---|
| 2010/0072383 A1 | 3/2010 | Okada | |
| 2014/0033283 A1* | 1/2014 | McSchooler | H04N 21/6143 726/4 |
| 2014/0183675 A1* | 7/2014 | Couture | H01L 27/14676 257/428 |
| 2015/0179832 A1* | 6/2015 | Wei | C30B 29/16 257/43 |
| 2015/0204987 A1* | 7/2015 | Okada | G01T 1/202 250/369 |
| 2015/0301199 A1* | 10/2015 | Nellissen | G01T 1/24 378/5 |
| 2018/0188390 A1* | 7/2018 | Jiang | A61B 6/4233 |
| 2019/0049597 A1* | 2/2019 | Tian | G01T 1/208 |

FOREIGN PATENT DOCUMENTS

| | | |
|---|---|---|
| CN | 103904091 A | 7/2014 |
| CN | 104704390 A | 6/2015 |
| CN | 105093259 A | 11/2015 |
| CN | 106653789 A | 5/2017 |
| JP | 2008215951 A | 9/2008 |

* cited by examiner

RAY DETECTOR AND RAY DETECTION PANEL

The application claims priority to the Chinese patent application No. 201811213295.5, filed on Oct. 18, 2018, the disclosure of which is incorporated herein by reference as part of the application.

TECHNICAL FIELD

Embodiments of the present disclosure relate to a ray detector and a ray detection panel.

BACKGROUND

X ray are widely used in fields such as medical perspective detection, industrial flaw detection and security check due to characteristics of high photon energy and strong penetrating power. A ray detector is a device that converts X-ray energy into an electrical signal which can be recorded. The ray detector is configured to receive X ray, and then generate an electrical signal proportional to intensity of X-ray radiation.

SUMMARY

At least one embodiment of the present disclosure provides a ray detector, including: a base substrate; a thin film transistor, including a gate electrode, a source electrode, and a drain electrode; a scintillator, configured to convert a ray into a visible light; and a photodetector, configured to detect the visible light converted by the scintillator and convert the visible light into an electrical signal, the scintillator is located on a side of the photodetector that is away from the base substrate, the photodetector includes: a first conductive structure; a semiconductor layer; a second conductive structure; a first dielectric layer, located between the first conductive structure and the semiconductor layer; and a second dielectric layer, located between the second conductive structure and the semiconductor layer; the second conductive structure is electrically connected with the source electrode; the thin film transistor is located between the base substrate and the photodetector; and an orthographic projection of the thin film transistor on the base substrate at least partially falls into an orthographic projection of the photodetector on the base substrate.

For example, in the ray detector provided by an embodiment of the present disclosure, a material of the first dielectric layer and the second dielectric layer includes at least one selected from the group consisting of aluminum oxide, silicon oxide, silicon nitride, and silicon oxynitride.

For example, in the ray detector provided by an embodiment of the present disclosure, the first conductive structure and the second conductive structure are provided in a same layer; and the first conductive structure and the second conductive structure form an interdigitated structure.

For example, in the ray detector provided by an embodiment of the present disclosure, the first conductive structure includes a plurality of first metal bars and a first connecting portion connected with the plurality of first metal bars; the second conductive structure includes a plurality of second metal bars and a second connecting portion connected with the plurality of second metal bars; and the plurality of first metal bars and the plurality of second metal bars are alternately arranged at intervals to form the interdigitated structure.

For example, in the ray detector provided by an embodiment of the present disclosure, the first dielectric layer and the second dielectric layer are a same dielectric layer, and completely cover the first conductive structure and the second conductive structure; the semiconductor layer is located on a side of the first dielectric layer and the second dielectric layer that is away from the first conductive structure and the second conductive structure; and the scintillator is located on a side of the semiconductor layer that is away from the first dielectric layer and the second dielectric layer.

For example, the ray detector provided by an embodiment of the present disclosure includes: a gate electrode layer, located on the base substrate; a gate insulating layer, located on a side of the gate electrode layer that is away from the base substrate; an active layer, located on a side of the gate insulating layer that is away from the gate electrode layer; a source-drain metal layer, located on a side of the active layer that is away from the gate insulating layer; the gate electrode is a portion of the gate electrode layer; and the source electrode and the drain electrode are respectively a portion of the source-drain metal layer.

For example, in the ray detector provided by an embodiment of the present disclosure, an orthographic projection of the source electrode on the base substrate at least partially overlaps with an orthographic projection of the second conductive structure on the base substrate.

For example, the ray detector provided by an embodiment of the present disclosure further includes: a first insulating layer, located on a side of the source-drain metal layer that is away from the active layer and the gate insulating layer; and a conductive layer, located on a side of the first insulating layer that is away from the source-drain metal layer, the conductive layer includes a light shielding structure; and the orthographic projection of the thin film transistor on the base substrate falls into an orthographic projection of the light shielding structure on the base substrate.

For example, the ray detector provided by an embodiment of the present disclosure further includes: a second insulating layer, located on a side of the conductive layer that is away from the first insulating layer, the photodetector is located on a side of the second insulating layer that is away from the conductive layer; the first insulating layer includes a first via hole; the conductive layer includes a connection electrode at least partially located in the first via hole; the second insulating layer includes a second via hole; and the second conductive structure is electrically connected with the connection electrode through the second via hole.

For example, in the ray detector provided by an embodiment of the present disclosure, orthographic projections of the first via hole and the second via hole on the base substrate fall into an orthographic projection of the second conductive structure on the base substrate.

For example, in the ray detector provided by an embodiment of the present disclosure, the orthographic projection of the first via hole on the base substrate and the orthographic projection of the second via hole on the base substrate do not overlap with each other.

For example, in the ray detector provided by an embodiment of the present disclosure, the gate electrode layer further includes a gate line; the source-drain metal layer further includes a data line; the data line is electrically connected with the drain electrode of the thin film transistor; and an orthographic projection of the data line on the base substrate and an orthographic projection of the first conductive structure on the base substrate have an overlapping region, the conductive layer further includes a first portion and a second portion; an orthographic projection of the gate line on the base substrate falls into an orthographic projection of the first portion on the base substrate; and the overlapping region falls into an orthographic projection of the second portion on the base substrate; the data line includes an extension portion located between the gate line and the overlapping region; the extension portion is located on a side of the gate line that is close to the source electrode; and an orthographic projection of the extension portion on the base substrate does not overlap with an orthographic projection of the conductive layer on the base substrate.

For example, in the ray detector provided by an embodiment of the present disclosure, the gate electrode layer further includes a third conductive structure; and an orthographic projection of the third conductive structure on the base substrate at least partially overlaps with an orthographic projection of the second conductive structure on the base substrate.

For example, in the ray detector provided by an embodiment of the present disclosure, the orthographic projection of the third conductive structure on the base substrate substantially overlaps with an orthographic projection of the source electrode on the base substrate.

For example, the ray detector provided by an embodiment of the present disclosure further includes a bias signal terminal, electrically connected with at least one of the third conductive structure and the first portion.

At least one embodiment of the present disclosure further provides a ray detection panel, including a plurality of the abovementioned ray detectors, the plurality of ray detectors are arranged in an array.

For example, in the ray detection panel provided by an embodiment of the present disclosure, the ray detection panel includes a detection region and a peripheral region surrounding the detection region; the ray detector includes a gate electrode layer and a conductive layer; the gate electrode layer further includes a third conductive structure; the conductive layer includes a first portion; and the ray detection panel further includes: a first connection line, electrically connecting third conductive structures of a row of the ray detectors, the first connection line extends from the detection region to the peripheral region; first portions of a row of the ray detectors are connected with each other in series to form a second connection line; and the second connection line also extends from the detection region to the peripheral region.

For example, in the ray detection panel provided by an embodiment of the present disclosure, the ray detector includes a source-drain metal layer, and the peripheral region further includes: a metal block, provided in a same layer and formed by using a same patterning process as the source electrode and the drain electrode of the thin film transistor, the metal block is insulated from the source electrode and the drain electrode, and the second connection line is electrically connected with the metal block.

For example, the ray detection panel provided by an embodiment of the present disclosure further includes: a first lead, located in the peripheral region and connecting a plurality of the first connection lines of a plurality of columns of the ray detectors; and a second lead, located in the peripheral region and connecting a plurality of the second connection lines of a plurality of columns of the ray detectors, in a region where the first connection line and the second lead overlap with each other, the second lead includes at least one opening.

For example, in the ray detection panel provided by an embodiment of the present disclosure, the first lead is provided in a same layer and formed by using a same patterning process as the source electrode and the drain electrode of the thin film transistor.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
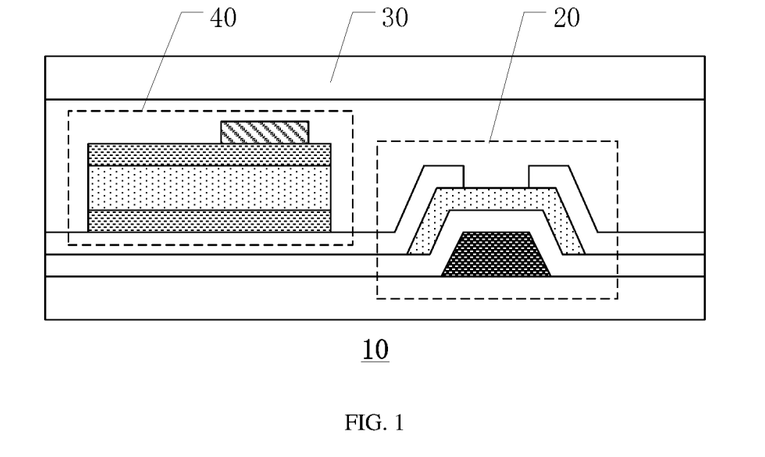
FIG. 1 is a structural schematic diagram of a conventional ray detector.

FIG. 1 is a structural schematic diagram of a conventional ray detector. As illustrated by FIG. 1, the ray detector 10 includes a thin film transistor 20, a scintillator 30 and a p-i-n photodiode detector 40. The thin film transistor 20 may serve as a switch; the scintillator 30 may be configured to convert a X ray into a visible light; a peak wavelength of visible light may be 530 nm to 580 nm; and a spectral range may reach 350 nm to 700 nm. The scintillator may be made of cesium iodide crystal (CsI) or gadolinium oxysulfide (GOS), etc. The p-i-n photodiode detector 40 is configured to convert light into an electrical signal. Because it is needed to dope a semiconductor layer of the p-i-n photodiode detector 40 in a preparation process of the p-i-n photodiode detector 40, the preparation process of the p-i-n photodiode detector 40 is more complicated and more costly. In addition, the preparation process of the p-i-n photodiode detector 40 is difficult to be compatible with a preparation process of the thin film transistor 20, so that a preparation process of the entire ray detector is more complex and more costly.

An inventor of the present application notices that: a photodetector of a metal-semiconductor-metal (MSM) structure does not require a doping process, and has advantages such as simple preparation process and low cost. In addition, the photodetector of the metal-semiconductor-metal (MSM) structure is compatible with the preparation process of the thin film transistor and is easy to integrate, so that the ray detector adopting the photodetector of the metal-semiconductor-metal (MSM) structure has advantages such as simple preparation process and low cost. However, the photodetector of the metal-semiconductor-metal (MSM) structure has relatively large dark current, low detective quantum efficiency (DQE), and low modulation transfer function (MTF).

With regard to this, embodiments of the present disclosure provide a ray detector and a ray detection panel. The ray detector includes a scintillator and a photodetector; the scintillator is configured to convert a ray into a visible light; and the photodetector is located on a light emitting side of the scintillator, and is configured to detect the visible light converted by the scintillator and convert the visible light into an electrical signal. The photodetector includes: a first conductive structure, a semiconductor layer, a second conductive structure, a first dielectric layer, and a second dielectric layer; the first dielectric layer is located between the first conductive structure and the semiconductor layer; and the second dielectric layer is located between the second conductive structure and the semiconductor layer. A preparation process of the photodetector does not require a doping process, and the preparation process of the photodetector is compatible with a preparation process of a thin film transistor, which, thus, may simplify a preparation process of the ray detector and reduce costs thereof. In addition, the ray detector may significantly reduce a dark current, and improve detective quantum efficiency and modulation transfer function.

Hereinafter, the ray detector and the ray detection panel provided by the embodiments of the present disclosure will be described in detail in conjunction with the accompanying drawings.

Figure 2:
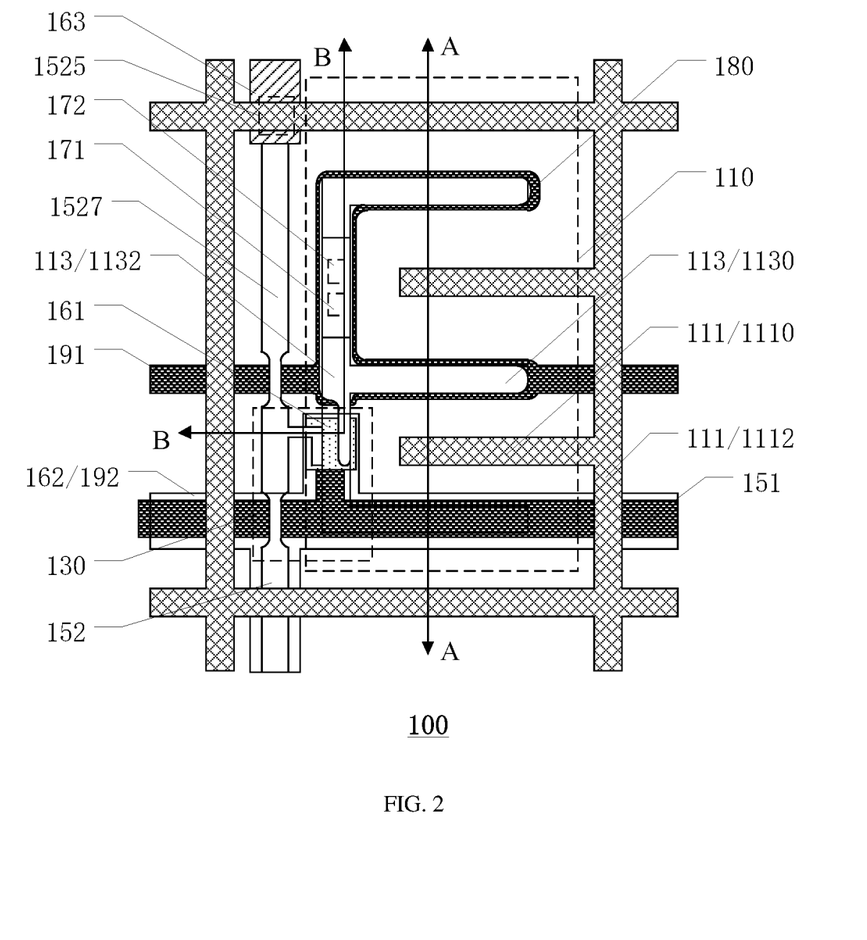
FIG. 2 is a structural schematic diagram of a ray detector provided by an embodiment of the present disclosure.
Figure 3:
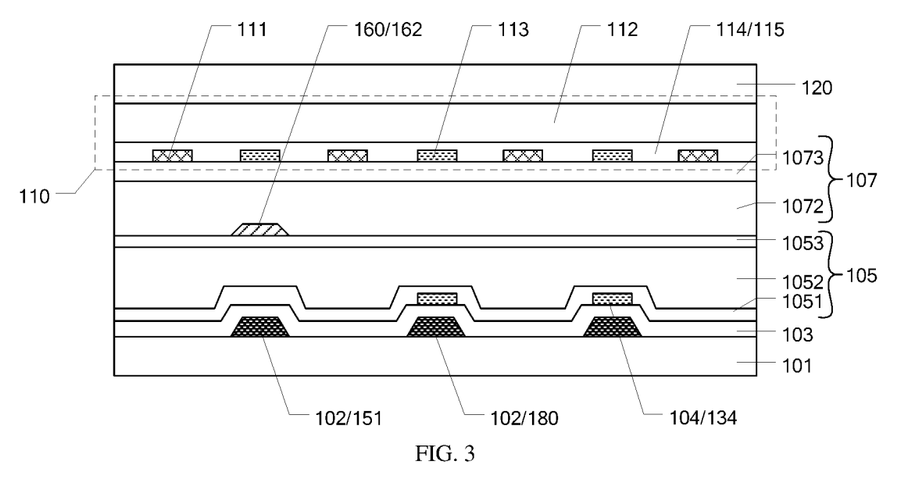
FIG. 3 is a cross-sectional schematic diagram of the ray detector provided by an embodiment of the present disclosure along an AA direction in FIG. 2.

An embodiment of the present disclosure provides a ray detector. FIG. 2 is a structural schematic diagram of the ray detector provided by the embodiment of the present disclosure; and FIG. 3 is a cross-sectional schematic diagram of the ray detector provided by the embodiment of the present disclosure along an AA direction in FIG. 2. As illustrated by FIG. 2 and FIG. 3, the ray detector 100 includes a photodetector 110 and a scintillator 120; the scintillator 120 is configured to convert a ray, for example, X ray or gamma rays, into visible light; and the photodetector 110 is configured to detect the visible light converted by the scintillator 120 and convert the detected visible light into an electrical signal. The photodetector 110 includes a first conductive structure 111, a semiconductor layer 112, a second conductive structure 113, a first dielectric layer 114 and a second dielectric layer 115. The first dielectric layer 114 is located between the first conductive structure 111 and the semiconductor layer 112; and the second dielectric layer 115 is located between the second conductive structure 113 and the semiconductor layer 112.

In the ray detector provided by the embodiment of the present disclosure, a ray conversion structure such as the scintillator may convert a ray into a visible light, for example, convert a X ray into a visible light; upon the visible light being irradiated onto the photodetector, the semiconductor layer receives the visible light and generates charges internally, causing resistance to reduce greatly, so as to convert the visible light into an electrical signal through a photovoltaic effect. In this case, an external bias voltage is mostly applied to the first dielectric layer and the second dielectric layer (which may be a same dielectric layer) having higher resistance; and upon the external bias voltage being high enough, the first dielectric layer and the second dielectric layer may be turned on through an F-N tunneling effect of electrons, and the electrical signal generated in the semiconductor layer may be read and stored by turning on and off a thin film transistor, to further achieve a purpose of ray detection. The photodetector has a metal-dielectric layer-semiconductor layer-dielectric layer-metal structure, a preparation process of the photodetector does not require a doping process, and the preparation process of the photodetector is compatible with a preparation process of the thin film transistor, which, thus, may simplify a preparation process of the ray detector and reduce costs thereof. In addition, the ray detector may significantly reduce a dark current, and improve detective quantum efficiency and modulation transfer function. It should be noted that, a peak wavelength of the above-described visible light may be 530 nm to 580 nm, and a spectral range may reach 350 nm to 700 nm.

In some examples, the above-described ray includes at least one of a X ray and a gamma ray.

For example, the scintillator may be made of cesium iodide crystal (CsI) or gadolinium oxysulfide (GOS).

In some examples, as illustrated by FIG. 2, the first conductive structure 111 and the second conductive structure 113 are provided in a same layer, and the first conductive structure 111 and the second conductive structure 113 form an interdigitated structure; in this case, the semiconductor layer 120 may be provided on the first conductive structure 111 and the second conductive structure 113 to prevent the first conductive structure 111 or the second conductive structure 113 from shielding light, which, thus, may facilitate the semiconductor layer to receive light and convert the light into an electrical signal, and may improve an effective detection area of the photodetector.

In some examples, as illustrated by FIG. 2, the first conductive structure 111 includes a plurality of first metal bars 1110 and a first connecting portion 1112 connected with the plurality of first metal bars 1110; the second conductive structure 113 includes a plurality of second metal bars 1130 and a second connecting portion 1132 connected with the plurality of second metal bars 1130; and the plurality of first metal bars 1110 and the plurality of second metal bars 1130 are alternately arranged at intervals to form the above-described interdigitated structure.

In some examples, as illustrated by FIG. 2 and FIG. 3, the ray detector further includes the scintillator 120 configured to convert a X ray into light; and the photodetector 110 is provided on a light emitting side of the scintillator 120 and is configured to detect light converted by the scintillator 120 and convert the light into an electrical signal.

In some examples, a material of the first dielectric layer 114 and the second dielectric layer 115 includes at least one selected from the group consisting of aluminum oxide, silicon oxide, silicon nitride, and silicon oxynitride. Aluminum oxide, silicon oxide, silicon nitride, and silicon oxynitride have good compactness, few defect states, and good insulating properties, and therefore, low-voltage driving may be implemented on the one hand, and the dark current may be further reduced on the other hand.

In some examples, the first dielectric layer 114 and the second dielectric layer 115 may be formed by atomic layer deposition or plasma enhanced vapor deposition, which, thus, may avoid a problem of uneven film formation.

In some examples, the first conductive structure 111 and the second conductive structure 113 may be made of a metal material, such as molybdenum, aluminum and copper. Of course, the embodiments of the present disclosure include but are not limited thereto, and the first conductive structure 111 and the second conductive structure 113 may also be made a transparent metal oxide, for example, indium tin oxide (ITO).

In some examples, the semiconductor layer 112 may be made of a semiconductor material such as amorphous silicon.

Figure 4:
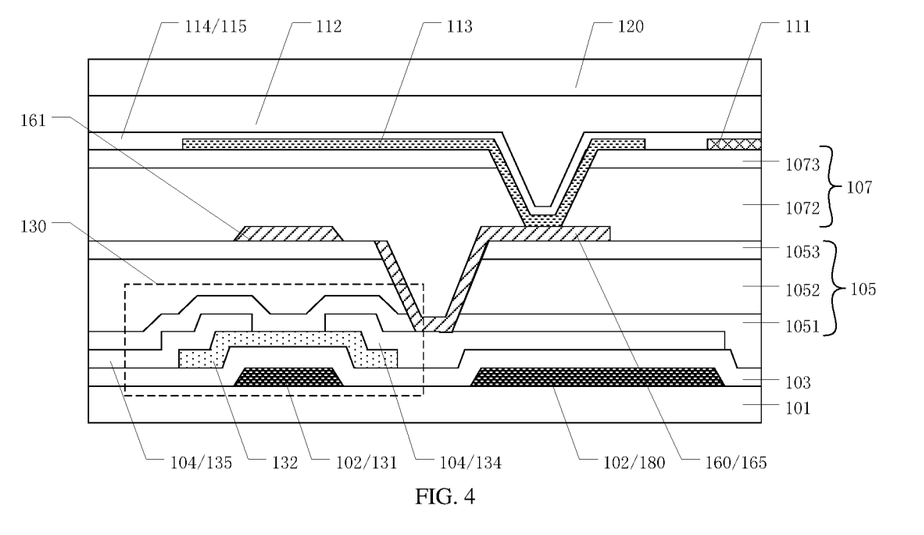
FIG. 4 is a cross-sectional schematic diagram of the ray detector provided by an embodiment of the present disclosure along a BB direction in FIG. 2.

FIG. 4 is a cross-sectional schematic diagram of the ray detector provided by the embodiment of the present disclosure along a BB direction in FIG. 2. As illustrated by FIG. 3 and FIG. 4, the ray detector further includes a base substrate 101 and a thin film transistor 130; the thin film transistor 130 includes a gate electrode 131, a source electrode 134 and a drain electrode 135; the second conductive structure 113 is electrically connected with the source electrode 134; the scintillator 120 is located on a side of the photodetector 110 that is away from the base substrate 101; the thin film transistor 130 is located between the base substrate 101 and the photodetector 110; and an orthographic projection of the thin film transistor 130 on the base substrate 101 at least partially falls into an orthographic projection of the photodetector 110 on the base substrate 101. Because the orthographic projection of the thin film transistor 130 on the base substrate 101 at least partially falls into the orthographic projection of the photodetector 110 on the base substrate 101, and the thin film transistor 130 is located between the base substrate 101 and the photodetector 110, a ratio of an area of the photodetector 110 to a total area of the ray detector 100 may be increased, so that an effective response area of the ray detector 100 may be increased, which may further improve the detective quantum efficiency and the modulation transfer function of the ray detector. It should be noted that, the area of the above-described photodetector may be an area of a surface where the photodetector is provided opposite to the scintillator, that is, an area of a surface for responding to or receiving light converted by the scintillator.

In some examples, 80% of the orthographic projection of the thin film transistor 130 on the base substrate 101 falls into the orthographic projection of the photodetector 110 on the base substrate 101. Therefore, the ray detector provided by the embodiment of the present disclosure may have an effective response area up to above 90%, while it is only 60% to 70% with respect to the ray detector adopting a p-i-n type photodetector.

For example, in the ray detector shown in FIG. 4, the second conductive structure 113 may be a sensing electrode, and the first conductive structure 111 may be a high-voltage electrode (an HV electrode).

In some examples, as illustrated by FIG. 3 and FIG. 4, in a case where the first conductive structure 111 and the second conductive structure 113 are provided in a same layer, the first dielectric layer 114 and the second dielectric layer 115 are a same dielectric layer, and completely cover the first conductive structure 111 and the second conductive structure 113, the semiconductor layer 112 is located on a side of the first dielectric layer 114 and the second dielectric layer 115 that is away from the first conductive structure 111 and the second conductive structure 113, and the scintillator 120 is located on a side of the semiconductor layer 112 that is away from the first dielectric layer 114 and the second dielectric layer 115. In this case, after the X ray are converted into light by the scintillator 120, the light converted by the scintillator 120 may be directly irradiated onto the semiconductor layer 112 without being shielded by the first conductive structure 111 or the second conductive structure 113, thereby further increasing the effective response area of the ray detector 100, which may further improve the detective quantum efficiency and the modulation transfer function of the ray detector.

In some examples, as illustrated by FIG. 3 and FIG. 4, the ray detector 100 includes a gate electrode layer 102, a gate insulating layer 103, an active layer 132 and a source-drain metal layer 104; the active layer 132 may be an active layer 132 of the thin film transistor 130; the gate electrode layer 102 is located on the base substrate 101; the gate insulating layer 103 is located on a side of the gate electrode layer 102 that is away from the base substrate 101; the active layer 132 is located on a side of the gate insulating layer 103 that is away from the gate electrode layer 102; and the source-drain metal layer 104 is located on a side of the active layer 132 that is away from the gate insulating layer 103. The gate electrode 131 of the thin film transistor 130 is located on the gate electrode layer 102, that is, the gate electrode 131 is a portion of the gate electrode layer 102; and the source electrode 134 and the drain electrode 135 of the thin film transistor 130 are located on the source-drain metal layer 104, that is, the source electrode 134 and the drain electrode 135 are respectively a portion of the source-drain metal layer 104. For example, as illustrated by FIG. 3 and FIG. 4, an orthographic projection of the gate electrode 131 on the base substrate 101 at least partially overlaps with an orthographic projection of the active layer 132 on the base substrate 101.

In some examples, as illustrated by FIG. 3 and FIG. 4, an orthographic projection of the source electrode 134 on the base substrate 101 at least partially overlaps with an orthographic projection of the second conductive structure 113 on the base substrate 101.

For example, in a case where the second conductive structure 113 and the first conductive structure 111 form the interdigitated structure, that is, the second conductive structure 113 includes the plurality of second metal bars 1130 and the second connecting portion 1132 connected with the plurality of second metal bars 1130, the orthographic projection of the source electrode 134 on the base substrate 101 also has portions corresponding to a part of the second metal bars 1130 and the second connecting portion 1132, so that an electrical connection between the source electrode 134 and the second conductive structure 113 may be implemented in a position outside a region where the thin film transistor 130 is located, which, thus, may improve flatness of the ray detector. For example, in a case where the second conductive structure 113 includes three second metal bars 1130, and two second metal bars 1130 are located on a side of the gate electrode 131 that is away from a gate line 151, the source electrode 134 may also have two bar-shaped portions corresponding to the two metal bars 1130 and a connecting portion connected with the two bar-shaped portions, to form a generally U-shaped structure, that is, a shape of the orthographic projection of the source electrode 134 on the base substrate 101 is approximately a U shape.

In some examples, as illustrated by FIG. 3 and FIG. 4, the ray detector 100 further includes a first insulating layer 105 and a conductive layer 160; the first insulating layer 105 is located on a side of the source-drain metal layer 104 that is away from the active layer 132 and the gate insulating layer 103; the conductive layer 160 is located on a side of the first insulating layer 105 that is away from the source-drain metal layer 104; the conductive layer 160 includes a light shielding structure 161; and the orthographic projection of the thin film transistor 130 on the base substrate 101 falls into an orthographic projection of the light shielding structure 161 on the base substrate 101. Therefore, the light shielding structure 161 may prevent the thin film transistor from being affected by light irradiation, so that detection accuracy of the ray detector may be increased. In addition, due to arrangement of the light shielding structure 161, the thin film transistor 130 may be provided on a side of the photodetector 110 that is away from the scintillator 120, so that the effective response area of the ray detector may be increased.

In some examples, as illustrated by FIG. 3 and FIG. 4, the orthographic projection of the light shielding structure 161 on the base substrate 101 at least partially overlaps with the orthographic projection of the second conductive structure 113 on the base substrate 101.

For example, in a case where the second conductive structure 113 and the first conductive structure 111 form the interdigitated structure, that is, in a case where the second conductive structure 113 includes the plurality of second metal bars 1130 and the second connecting portion 1132 connected with the plurality of second metal bars 1130, the orthographic projection of the light shielding structure 161 on the base substrate 101 at least partially overlaps with the orthographic projection of the second connecting portion 1132 on the base substrate 101, so that storage capacitance may be formed between the light shielding structure 161 and the second conductive structure 113.

For example, as illustrated by FIG. 3 and FIG. 4, the first insulating layer 105 includes a passivation layer 1051, a first planarization layer 1052 and a first buffer layer 1053. The passivation layer 1051 is provided on a side of the source-drain metal layer 104 that is away from the active layer 132 and the gate insulating layer 103; the first planarization layer 1052 is provided on a side of the passivation layer 1051 that is away from the source-drain metal layer 104; and the first buffer layer 1053 is provided on a side of the first planarization layer 1052 that is away from the passivation layer 1051. Therefore, the first planarization layer 1052 may be used to planarize a film layer below the first planarization layer 1052 (a side close to the base substrate 101), and the first buffer layer 1053 may be used to increase an adhesive force between the conductive layer 160 and the first planarization layer 1052, to prevent a structure in the conductive layer 160 from falling off or from being displaced from the first planarization layer 1052.

For example, a material of the passivation layer 1051 may be one or more selected from the group consisting of silicon oxide, silicon nitride, and silicon oxynitride. The first planarization layer 1052 may be made of an organic material, for example, an organic resin. A material of the first buffer layer 1053 may be one or more selected from the group consisting of silicon oxide, silicon nitride, and silicon oxynitride.

In some examples, as illustrated by FIG. 3 and FIG. 4, the ray detector 100 further includes a second insulating layer 107. The second insulating layer 107 is located on a side of the conductive layer 160 that is away from the first insulating layer 105. The photodetector 110 is located on a side of the second insulating layer 107 that is away from the conductive layer 160. The first insulating layer 105 is provided therein with a first via hole 171; the conductive layer 160 includes a connection electrode 165 at least partially located in the first via hole 171; the second insulating layer 107 includes a second via hole 172; and the second conductive structure 113 is electrically connected with the connection electrode 165 through the second via hole 172. Therefore, since there are more and thicker film layers between the second conductive structure 113 and the source electrode 134 of the thin film transistor 130, as compared with a case where a connection between the second conductive structure 113 and the source electrode 134 of the thin film transistor 130 is implemented through one via hole, the ray detector 100 may have the connection between the second conductive structure 113 and the source electrode 134 of the thin film transistor 130 implemented through the first via hole 171 and the second via hole 172, which may increase stability of the connection.

For example, as illustrated by FIG. 3 and FIG. 4, the second insulating layer 107 includes a second planarization layer 1072 and a second buffer layer 1073. The second planarization layer 1072 is provided on a side of a metal layer 160 that is away from the first insulating layer 105, and the second buffer layer 1073 is provided on a side of the second planarization layer 1072 that is away from the metal layer 160. The second planarization layer 1072 is used to planarize a film layer below the second planarization layer 1072 (the side close to the base substrate 101), and the second buffer layer 1073 is used to increase an adhesive force of the second planarization layer 1072 with the first conductive structure 111 and the second conductive structure 113, to prevent the first conductive structure 111 or the second conductive structure 113 from falling off or from being displaced from the second planarization layer 1072.

For example, the second planarization layer 1072 may be made of an organic material, for example, an organic resin. A material of the second buffer layer 1073 may be one or more selected from the group consisting of silicon oxide, silicon nitride, and silicon oxynitride.

In some examples, as illustrated by FIG. 2 to FIG. 4, orthographic projections of the first via hole 171 and the second via hole 172 on the base substrate 101 fall into the orthographic projection of the second conductive structure 113 on the base substrate 101, which facilitates implementing an electrical connection between the second conductive structure 113 and the source electrode 134.

In some examples, as illustrated by FIG. 2 to FIG. 4, the orthographic projection of the first via hole 171 on the base substrate 101 and the orthographic projection of the second via hole 172 on the base substrate 101 do not overlap with each other.

In some examples, as illustrated by FIG. 3 and FIG. 4, the orthographic projections of the first via hole 171 and the second via hole 172 on the base substrate 101 do not overlap with the orthographic projection of the thin film transistor 130 on the base substrate 101. As compared with other positions of the ray detector, positions of the first via hole 171 and the second via hole 172 are higher, and a position of the thin film transistor 130 is higher, so the entire ray detector may be flatter upon the orthographic projections of the first via hole 171 and the second via hole 172 on the base substrate 101 not overlapping with the orthographic projection of the thin film transistor 130 on the base substrate 101.

In some examples, as illustrated by FIG. 2 to FIG. 4, the gate electrode layer 102 further includes the gate line 151; the source-drain metal layer 104 further includes a data line 152; the data line 152 is electrically connected with the drain electrode 135 of the thin film transistor 130; the data line 152 and the first conductive structure 111 have an overlapping region 1525; the conductive layer 160 further includes a first portion 162 and a second portion 163; an orthographic projection of the gate line 151 on the base substrate 101 falls into an orthographic projection of the first portion 162 on the base substrate 101; an orthographic projection of the overlapping region 1525 on the base substrate 101 falls into an orthographic projection of the second portion 163 on the base substrate 101; the data line 152 includes an extension portion 1527 located between the gate line 151 and the overlapping region 1525; the extension portion 1527 is located on a side of the gate line 151 that is close to the source electrode 134; and an orthographic projection of the extension portion 1527 on the base substrate 101 does not overlap with an orthographic projection of the conductive layer 160 on the base substrate 101. The orthographic projection of the overlapping region 1525 on the base substrate 101 falls into the orthographic projection of the second portion 163 on the base substrate 101, which may reduce coupling capacitance between the first conductive structure 111 and the data line 152, and may further reduce a thermal noise of the data line 152.

It should be noted that, if the orthographic projection of the extension portion 1527 of the data line 152 that is located between the gate line 151 and the overlapping region 1525 on the base substrate 101 overlaps with the orthographic projection of the conductive layer 160 on the base substrate 101, then the conductive layer 160 completely covers the thin film transistor 130 and the data line 152 as described above, so that capacitive reactance of the coupling capacitance between the data line 152 and the conductive layer 160 is relatively large. Since a thermal noise formula of the data line 152 is kTC, wherein the larger the capacitive reactance C, the larger the noise. However, in the ray detector provided by the example, the orthographic projection of the extension portion 1527 of the data line 152 that is located between the gate line 151 and the overlapping region 1525 on the base substrate 101 does not overlap with the orthographic projection of the conductive layer 160 on the base substrate 101, which may reduce a magnitude of the coupling capacitance between the data line 152 and the conductive layer 160, and achieve an effect of reducing the thermal noise of the data line.

In some examples, as illustrated by FIG. 3 and FIG. 4, the light shielding structure 161 of the conductive layer 160 is connected with the first portion 162; and a third light shielding layer 163 is separated from the light shielding structure 161 and the first portion 162. In addition, a connection layer 165 is also separated and insulated from the light shielding structure 161, the first portion 162 and the second portion 163.

In some examples, as illustrated by FIG. 3 and FIG. 4, the gate electrode layer 102 further includes a third conductive structure 180; and an orthographic projection of the third conductive structure 180 on the base substrate 101 at least partially overlaps with the orthographic projection of the second conductive structure 113 on the base substrate 101. In this case, the third conductive structure 180 and the second conductive structure 113 may form a first coupling capacitor, that is, a first storage capacitor Cst1; the light shielding structure 161 and/or the first portion 162 and the second conductive structure 113 may form a second coupling capacitor, that is, a second storage capacitor Cst2, so that an equivalent circuit diagram shown in FIG. 5 may be obtained.

Figure 5:
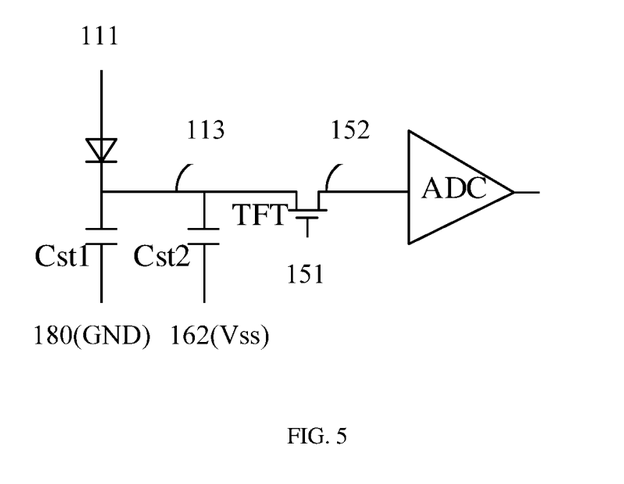
FIG. 5 is an equivalent circuit diagram of the ray detector provided by an embodiment of the present disclosure.

For example, as illustrated by FIG. 5, if the third conductive structure 180 is grounded, then the first portion 162 is grounded. In this case, the second conductive structure 113 is connected with the source electrode 134 of the thin film transistor 130, and an induced voltage on the second conductive structure 113 is relatively large, which may easily cause a larger leakage current of the thin film transistor 130. For example, the induced voltage on the second conductive structure 113 may reach 0.875 V to 15 V; and upon the induced voltage being 15 V, a source-drain electrode voltage $V_{DS}$ of the thin film transistor 130 being higher, rendering a larger leakage current of the thin film transistor 130, so that a noise generated by the thin film transistor 130 is relatively large.

In some examples, the ray detector further includes a bias signal terminal $V_{SS}$, which is electrically connected with at least one of the third conductive structure 180 and the first portion 162.

For example, in the ray detector provided by the example, at least one of the third conductive structure 180 and the first portion 162 may be connected with the bias signal terminal $V_{SS}$, for example, the bias signal terminal $V_{SS}$ may be loaded with a negative voltage of −15 V to −8 V, so as to reduce the induced voltage on the second conductive structure 113, and further reduce the source-drain electrode voltage $V_{DS}$ of the thin film transistor 130, thereby reducing the noise generated by the thin film transistor 130. For example, upon the voltage at the above-described bias signal terminal $V_{SS}$ being −8 V, in a case where the voltage on the data line is continuously 0.875 V, the induced voltage on the second conductive structure 113 will decrease from a range of 0.875 V to 15 V to a range of 0.875 V to 7 V, that is, a maximum value of the induced voltage is reduced from 15 V to 7 V, which, thus, may significantly reduce the noise generated by the thin film transistor 130.

It should be noted that, the case where at least one of the third conductive structure 180 and the first portion 162 is connected with the bias signal terminal $V_{SS}$ may include a case where the third conductive structure 180 is connected with the bias signal terminal $V_{SS}$, and the first portion 162 is grounded, a case where the third conductive structure 180 is grounded, and the first portion 162 is connected with the bias signal terminal $V_{SS}$, and a case where the third conductive structure 180 and the first portion 162 are both connected with the bias signal terminal $V_{SS}$.

In some examples, as illustrated by FIG. 2 to FIG. 4, the orthographic projection of the third conductive structure 180 on the base substrate 101 substantially overlaps with the orthographic projection of the source electrode 134 on the base substrate 101, which, thus, facilitates the third conductive structure 180 and the second conductive structure 113 to form the above-described first coupling capacitor. It should be noted that, the above-described case of "substantially overlapping" includes a case where the orthographic projection of the third conductive structure on the base substrate completely overlaps with the orthographic projection of the source electrode on the base substrate, and also includes a case where an area difference between the orthographic projection of the third conductive structure on the base substrate and the orthographic projection of the source electrode on the base substrate is less than 10%.

Table 1 shows a relationship between the source-drain electrode voltage $V_{DS}$ and the leakage current $I_{off}$ of the thin film transistor in the ray detector provided by the embodiment of the present disclosure. As illustrated by Table 1, upon the source-drain electrode voltage $V_{DS}$ being 0.1 V to 7 V, the leakage current $I_{off}$ of the thin film transistor is below 20 fA, which belongs to a relatively low level. Upon the source-drain electrode voltage $V_{DS}$ being 15 V, the leakage current $I_{off}$ of the thin film transistor rises by an order of magnitude. A shot noise formula of the thin film transistor is: $\sigma_{S\text{-}TFT}=\sqrt{Q_L/q}$, so, upon the source-drain electrode voltage $V_DS$ being 0.1 V to 7 V, a shot noise of the thin film transistor is lower than a shot noise upon the source-drain electrode voltage $V_{DS}$ being 15V. It should be noted that, the ray detector shown in Table 1 is an X-ray detector.

TABLE 1

Relationship between source-drain electrode voltage $V_{DS}$ and leakage current $I_{off}$ of thin film transistor in ray detector

| $V_{DS}$ (V) | 0.1 | 0.3 | 0.5 | 0.7 | 1 | 3 | 5 | 7 | 9 | 11 | 13 | 15 |
|---|---|---|---|---|---|---|---|---|---|---|---|---|
| $I_{off}$ (fA) | 2 | 4 | 3 | 4 | 4 | 7 | 11 | 20 | 37 | 67 | 154 | 251 |

On the other hand, since a voltage difference between the above-described first coupling capacitor is reduced, a voltage difference between the second coupling capacitor is reduced, so that an amount of charges stored between the first coupling capacitor is also reduced accordingly, and an amount of charges stored between the second coupling capacitor is also reduced accordingly, which accelerates a conversion speed of the first coupling capacitor in the ray detector, and is favorable for improving a detection speed and efficiency.

Table 2 shows comparison results of various noises of the ray detector provided by the embodiment of the present disclosure. As illustrated by Table 2, the noise of the data line of the ray detector provided by the embodiment of the present disclosure is greatly reduced, which is even slightly better than that of the p-i-n type ray detector. It should be noted that, the ray detector shown in Table 2 is an X-ray detector.

Table 3 shows signal-to-noise ratio simulation results of the ray detector provided by the embodiment of the present disclosure. As illustrated by Table 3, the ray detector provided by the embodiment of the present disclosure has a high signal-to-noise ratio, which is even slightly higher than that of the ray detector of the p-i-n type. It should be noted that, the ray detector shown in Table 3 is an X-ray detector.

TABLE 3

SNR simulation results

| | Aperture ratio | Signal (e-) | Signal-to-noise ratio | Decibel signal-to-noise ratio |
|---|---|---|---|---|
| Conventional ray detector | 86% | 1.94E+06 | 694.32 | 56.8 |
| Ray detector provided by the present disclosure | 93% | 2.1E+06 | 965.05 | 59.7 |
| Ray detector of p-i-n structure | 60% | 1.25E+06 | 621.44 | 55.9 |

Figure 6:
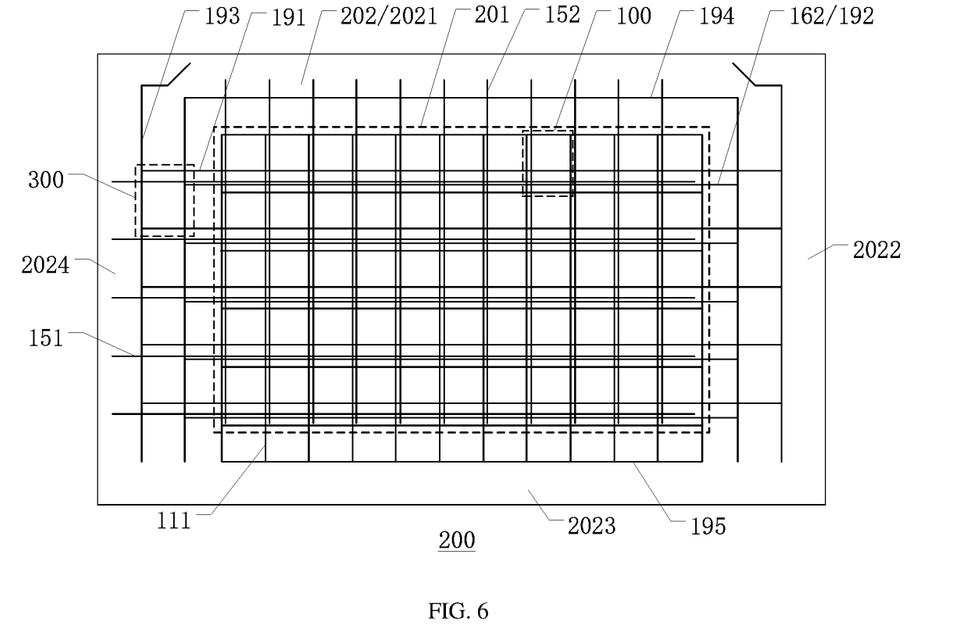
FIG. 6 is a schematic diagram of a ray detection panel provided by an embodiment of the present disclosure.

At least one embodiment of the present disclosure further provides a ray detection panel. FIG. 6 is a schematic diagram of the ray detection panel provided by the embodiment of the present disclosure. As illustrated by FIG. 6, the ray detection panel 200 includes the ray detector 100 provided by the above-described embodiment. A plurality of the ray detectors 100 may be arranged in an array. Since the ray detection panel includes the above-described ray detector, the ray detection panel has same beneficial technical effects, for which the related description of the above-described embodiments may be referred to, and no details will be repeated here.

In some examples, as illustrated by FIG. 6, the ray detection panel 200 includes a detection region 201 and a peripheral region 202 surrounding the detection region 201. The ray detection panel 200 further includes a first connection line 191 that electrically connects third conductive structures 180 of a row of ray detectors 100; and the first connection line 191 extends from the detection region 201 to the peripheral region 202. First portions 162 of a row of ray detectors 100 are connected with each other in series to form a second connection line 192; and the second connection line 192 also extends from the detection region 201 to the peripheral region 202. The first connection line 191 and the second connection line 192 are connected with a driving circuit of the peripheral region 202, to apply an electrical signal to the third conductive structures 180 and the first portions 162.

TABLE 2

Comparison results of various noises

| | Pixel capacitor thermal noise (e-) | Leakage current thermal noise (e-) | Noise of leakage current from high voltage cable to data line (e-) | TFT leakage noise (e-) | Noise of TFT capturing charges (e-) | TFT switching noise (e-) | Data line thermal noise (e-) | ROIC noise (e-) | Total noise (e-) |
|---|---|---|---|---|---|---|---|---|---|
| Conventional ray detector | 400.90 | 593.19 | 0.00 | 90.51 | 259.81 | 1000.00 | 2208.34 | 1150 | 2790.62 |
| Ray detector provided by the present disclosure | 392.80 | 616.85 | 128.00 | 90.51 | 259.81 | 1000.00 | 1444.65 | 1000 | 2171.15 |
| Ray detector of p-i-n structure | 621.07 | 202.27 | 0.00 | 90.51 | 335.41 | 1000.00 | 1477.96 | 1000 | 2175.25 |

In some examples, as illustrated by FIG. 6, the ray detection panel 200 further includes a first lead 193 and a second lead 194 that are located in the peripheral region 202;

the first lead 193 connects first connection lines 191 of a plurality of columns of ray detectors 100, and couples the same to a corresponding driving circuit; the second lead 194 connects second connection lines 192 of a plurality of columns of ray detectors 100, and couples the same to a corresponding driving circuit.

In some examples, as illustrated by FIG. 6, the peripheral region 202 of the ray detection panel 200 is further provided with a third lead 195, which is electrically connected with a grid-shaped first conductive structure 111, to provide the first conductive structure 111 with a voltage, for example, a high voltage.

In some examples, as illustrated by FIG. 6, the peripheral region 202 of the ray detection panel 200 includes a first sub-peripheral region 2021, a second sub-peripheral region 2022, a third sub-peripheral region 2023 and a fourth sub-peripheral region 2024. The first sub-peripheral region 2021 and the third sub-peripheral region 2023 are provided opposite to each other, and the second sub-peripheral region 2022 and the third sub-peripheral region 2023 are respectively adjacent to the first sub-peripheral region 2021. In this case, the data line 152 may extend from the detection region 201 to the first sub-peripheral region 2021, so that an electrical signal processing circuit such as an amplifying circuit may be provided in the first sub-peripheral region 2021; the gate line 151 may extend from the detection region to the fourth sub-peripheral region 2024, so that a driving circuit for driving the gate line 151 may be provided in the fourth sub-peripheral region 2024; the first lead 193 may extend in a direction from the first sub-peripheral region 2021 to the third sub-peripheral region 2023, which, thus, may have a driving circuit for applying a bias voltage provided or may be grounded in at least one of the first sub-peripheral region 2021 and the third sub-peripheral region 2023; and the second lead 194 may be provided in the first sub-peripheral region 2021, the second sub-peripheral region 2022 and the fourth sub-peripheral region 2024, and have both ends thereof extend to the third sub-peripheral region 2023, which, thus, may have a driving circuit for applying a bias voltage provided or may be grounded in the third sub-peripheral region 2023. Thus, the ray detection panel can make full use of an area of the peripheral region.

Figure 7:
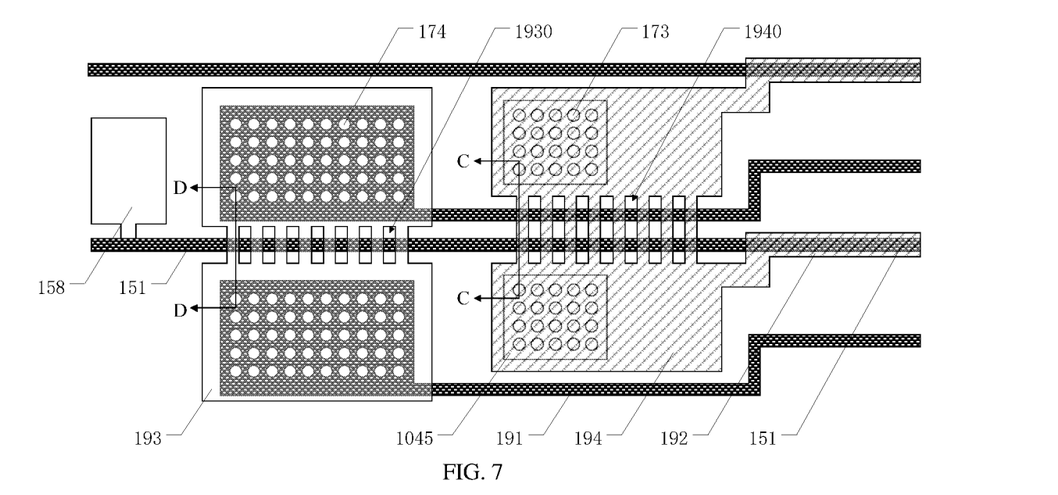
FIG. 7 is an enlarged schematic diagram of the ray detection panel provided by an embodiment of the present disclosure in a dotted frame 300 in FIG. 6.
Figure 8:
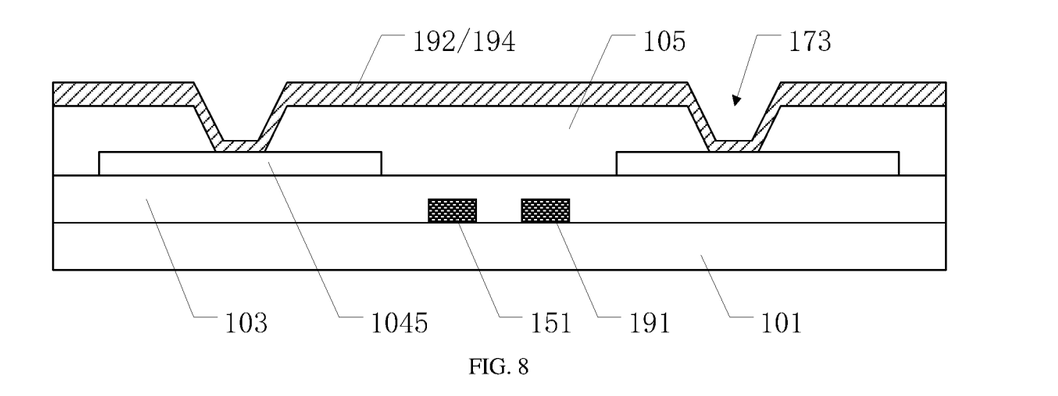
FIG. 8 is a structural schematic diagram of the ray detection panel provided by an embodiment of the present disclosure in a CC direction in FIG. 7.

FIG. 7 is an enlarged schematic diagram of the ray detection panel provided by the embodiment of the present disclosure in a dotted frame 300 in FIG. 6. FIG. 8 is a structural schematic diagram of the ray detection panel provided by the embodiment of the present disclosure in a CC direction in FIG. 7. As illustrated by FIG. 7 and FIG. 8, the second connection line 192 and the second lead 194 may be provided in a same layer as a conductive layer 160 in the detection region 201, that is, the second connection line 192 and the second lead 194 are located on a side of a first insulating layer 105 that is away from a base substrate 101. The peripheral region 202 of the ray detection panel 200 further includes a metal block 1045; the metal block 1045 may be provided in a same layer and formed by using a same patterning process as a source-drain metal layer 104 in the detection region 201, that is, the metal block 1045 may be provided in a same layer and formed by using a same patterning process as a source electrode 134 and a drain electrode 135 of a thin film transistor 130 in the detection region 201. In addition, the metal block 1045 and the source-drain metal layer 104 in the detection region 201 are insulated from each other. The second connection line 192 is electrically connected with the metal block 1045 through a third via hole 173 in the first insulating layer 105, so that resistance of the second connection line 192 may be reduced without increasing process steps.

For example, as illustrated by FIG. 7 and FIG. 8, the above-described third via hole 173 may be set as plural, which thus, may improve stability of an electrical connection between the second connection line 192 and the metal block 1045 and further reduce resistance.

For example, as illustrated by FIG. 7 and FIG. 8, the above-described metal block 1045 is an island-like metal block 1045 provided between a gate line 151 and a first connection line 191 adjacent to each other, that is, adjacent metal blocks 1045 are not directly connected with each other, but connected with the second lead 194 through the third via hole 173. It is also not connected with the gate line 151 and the first connection line 191.

For example, as illustrated by FIG. 7 and FIG. 8, a width of the second lead 194 is 10 times larger than that of the first connection line 191 in the detection region 201, so that resistance of the second lead 194 may be significantly reduced, which facilitates applying an electrical signal to the second connection lines 192 of the plurality of columns of ray detectors 100.

Figure 9:
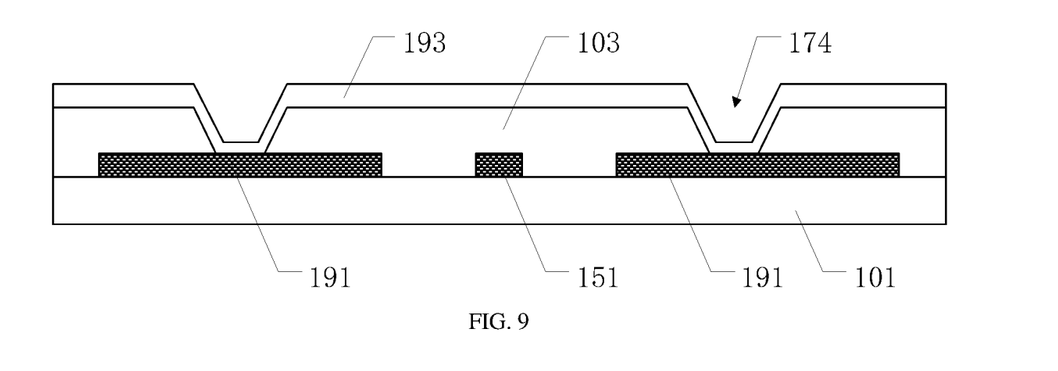
FIG. 9 is a structural schematic diagram of the ray detection panel provided by an embodiment of the present disclosure in a DD direction in FIG. 7.

FIG. 9 is a structural schematic diagram of the ray detection panel provided by the embodiment of the present disclosure in a DD direction in FIG. 7. As illustrated by FIG. 7 and FIG. 9, the first connection line 191 may be provided in a same layer and formed by using a same patterning process as a gate electrode 131 of the thin film transistor 130. In this case, the first connection line 191 is located on a side of the gate insulating layer 103 that is close to the base substrate 101; and the first lead 193 may be provided in a same layer and formed by using a same patterning process as the source-drain metal layer 104, that is, the first lead 193 may be provided in a same layer and formed by using a same patterning process as the source electrode 134 and the drain electrode 135 of the thin film transistor 130. The first lead 193 may be electrically connected with the first connection line 191 through a fourth via hole 174, which, thus, may avoid an additional mask process, reduce fabrication difficulties and fabrication costs.

For example, in some examples, as illustrated by FIG. 7, in a region where the first connection line 191 and the second lead 194 overlap with each other and a region where the gate line 151 and the second lead 194 overlap with each other, in order to reduce parasitic capacitance between the first connection line 191 and the second lead 194 as well as parasitic capacitance between the gate line 151 and the second lead 194, at least one first opening 1940 may be provided on the second lead 194, and an orthographic projection of the first opening 1940 on the base substrate 101 covers the first connection line 191 and the gate line 151, so that signal delay of the gate line 151, the first connection line 191 and the second lead 194 may be reduced.

For example, as illustrated by FIG. 7, the second lead 194 is provided thereon with a plurality of first openings 1940, for example, nine first openings 1940, thereby significantly reducing the parasitic capacitance between the first connection line 191 and the second lead 194, as well as the parasitic capacitance between the gate line 151 and the second lead 194, so as to reduce the signal delay of the gate line 151, the first connection line 191 and the second lead 194.

For example, in some examples, as illustrated by FIG. 7, in an overlapping region of the gate line 151 and the first lead 193, in order to reduce parasitic capacitance between the gate line 151 and the first lead 193, the first lead 193 may be provided thereon with at least one second opening 1930, and an orthographic projection of the second opening 1930 on the base substrate 101 covers the gate line 151, so that signal delay of the gate line 151 and the first lead 193 may be reduced.

For example, as illustrated by FIG. 7, the first lead 193 is provided thereon with a plurality of second openings 1930, for example, nine second openings 1930, thereby significantly reducing the parasitic capacitance between the gate line 151 and the first lead 193, so as to reduce the signal delay of the gate line 151 and the first lead 193.

For example, in some examples, as illustrated by FIG. 7, the peripheral region 202 of the ray detection panel 200 further includes an electrostatic discharge circuit 158, which is electrically connected with the gate line 151, to provide electrostatic protection to the gate line 151. For example, as illustrated by FIG. 7, the electrostatic discharge circuit 158 is provided on a side of the first lead 193 that is away from the second lead 194.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, variations or replacements within the technical scope disclosed by the present disclosure which can be easily envisaged by any skilled in the art shall fall in the protection scope of the present disclosure. Thus, the protection scope of the present disclosure should be based on the protection scope of the claims.

The invention claimed is:

1. A ray detector, comprising:
a base substrate;
a thin film transistor, comprising a gate electrode, a source electrode, and a drain electrode;
a scintillator, configured to convert a ray into a visible light; and
a photodetector, configured to detect the visible light converted by the scintillator and convert the visible light into an electrical signal,
wherein the scintillator is located on a side of the photodetector that is away from the base substrate, the photodetector comprises: a first conductive structure; a semiconductor layer; a second conductive structure; a first dielectric layer, located between the first conductive structure and the semiconductor layer; and a second dielectric layer, located between the second conductive structure and the semiconductor layer; the second conductive structure is electrically connected with the source electrode; the thin film transistor is located between the base substrate and the photodetector; and an orthographic projection of the thin film transistor on the base substrate at least partially falls into an orthographic projection of the photodetector on the base substrate,
the ray detector further comprises:
a gate electrode layer, located on the base substrate;
a gate insulating layer, located on a side of the gate electrode layer that is away from the base substrate;
an active layer, located on a side of the gate insulating layer that is away from the gate electrode layer;
a source-drain metal layer, located on a side of the active layer that is away from the gate insulating layer;

a second insulating layer, located on a side of the conductive layer that is away from the first insulating layer,
wherein the gate electrode is a portion of the gate electrode layer; and the source electrode and the drain electrode are respectively a portion of the source-drain metal layer,
the photodetector is located on a side of the second insulating layer that is away from the conductive layer; the first insulating layer comprises a first via hole; the conductive layer comprises a connection electrode at least partially located in the first via hole; the second insulating layer comprises a second via hole; and the second conductive structure is electrically connected with the connection electrode through the second via hole.

2. The ray detector according to claim 1, wherein orthographic projections of the first via hole and the second via hole on the base substrate fall into an orthographic projection of the second conductive structure on the base substrate.

3. The ray detector according to claim 2, wherein the orthographic projection of the first via hole on the base substrate and the orthographic projection of the second via hole on the base substrate do not overlap with each other.

4. The ray detector according to claim 1, wherein the gate electrode layer further comprises a gate line; the source-drain metal layer further comprises a data line; the data line is electrically connected with the drain electrode of the thin film transistor; and an orthographic projection of the data line on the base substrate and an orthographic projection of the first conductive structure on the base substrate have an overlapping region,
the conductive layer further comprises a first portion and a second portion; an orthographic projection of the gate line on the base substrate falls into an orthographic projection of the first portion on the base substrate; and the overlapping region falls into an orthographic projection of the second portion on the base substrate;
the data line comprises an extension portion located between the gate line and the overlapping region; the extension portion is located on a side of the gate line that is close to the source electrode; and an orthographic projection of the extension portion on the base substrate does not overlap with an orthographic projection of the conductive layer on the base substrate.

5. The ray detector according to claim 4, wherein the gate electrode layer further comprises a third conductive structure; and an orthographic projection of the third conductive structure on the base substrate at least partially overlaps with an orthographic projection of the second conductive structure on the base substrate.

6. The ray detector according to claim 5, wherein the orthographic projection of the third conductive structure on the base substrate substantially overlaps with an orthographic projection of the source electrode on the base substrate.

7. The ray detector according to claim 5, further comprising a bias signal terminal, electrically connected with at least one of the third conductive structure and the first portion.

8. A ray detection panel, comprising a plurality of the ray detectors according to claim 1,
wherein the plurality of ray detectors are arranged in an array.

9. The ray detection panel according to claim 8, wherein the ray detection panel comprises a detection region and a peripheral region surrounding the detection region; the ray detector comprises a gate electrode layer and a conductive layer; the gate electrode layer further comprises a third conductive structure; the conductive layer comprises a first portion; and the ray detection panel further comprises:

a first connection line, electrically connecting third conductive structures of a row of the ray detectors, wherein the first connection line extends from the detection region to the peripheral region; first portions of a row of the ray detectors are connected with each other in series to form a second connection line; and the second connection line also extends from the detection region to the peripheral region.

10. The ray detection panel according to claim 9, wherein the ray detector comprises a source-drain metal layer, and the peripheral region further comprises:

a metal block, provided in a same layer and formed by using a same patterning process as the source electrode and the drain electrode of the thin film transistor, wherein the metal block is insulated from the source electrode and the drain electrode, and the second connection line is electrically connected with the metal block.

11. The ray detection panel according to claim 9, further comprising:

a first lead, located in the peripheral region and connecting a plurality of the first connection lines of a plurality of columns of the ray detectors; and a second lead, located in the peripheral region and connecting a plurality of the second connection lines of a plurality of columns of the ray detectors, wherein, in a region where the first connection line and the second lead overlap with each other, the second lead comprises at least one opening.

12. The ray detection panel according to claim 11, wherein the first lead is provided in a same layer and formed by using a same patterning process as the source electrode and the drain electrode of the thin film transistor.

13. The ray detector according to claim 1, wherein the first conductive structure and the second conductive structure are provided in a same layer; and the first conductive structure and the second conductive structure form an interdigitated structure.

14. The ray detector according to claim 1, wherein a material of the first dielectric layer and the second dielectric layer comprises at least one selected from the group consisting of aluminum oxide, silicon oxide, silicon nitride, and silicon oxynitride.

15. The ray detector according to claim 1, wherein the first conductive structure comprises a plurality of first metal bars and a first connecting portion connected with the plurality of first metal bars; the second conductive structure comprises a plurality of second metal bars and a second connecting portion connected with the plurality of second metal bars; and the plurality of first metal bars and the plurality of second metal bars are alternately arranged at intervals to form the interdigitated structure.

16. The ray detector according to claim 1, wherein the first dielectric layer and the second dielectric layer are a same dielectric layer, and completely cover the first conductive structure and the second conductive structure; the semiconductor layer is located on a side of the first dielectric layer that is away from the first conductive structure and the second conductive structure; and the scintillator is located on a side of the semiconductor layer that is away from the first dielectric layer and the second dielectric layer.

17. The ray detector according to claim 1, wherein an orthographic projection of the source electrode on the base substrate at least partially overlaps with an orthographic projection of the second conductive structure on the base substrate.

* * * * *